United States Patent [19]

Duley

[11] 4,264,879
[45] Apr. 28, 1981

[54] INTERVAL TIMER CIRCUIT RELAXATION OSCILLATOR

[75] Inventor: Raymond S. Duley, Spring Valley, Ohio

[73] Assignee: NCR Corporation, Dayton, Ohio

[21] Appl. No.: 970,769

[22] Filed: Dec. 18, 1978

[51] Int. Cl.³ .......................................... H03K 3/023
[52] U.S. Cl. .................................... 331/111; 331/143
[58] Field of Search ..................... 331/108 D, 111, 143

[56] References Cited

U.S. PATENT DOCUMENTS

| | | | |
|---|---|---|---|
| 3,693,030 | 9/1972 | Walters | 307/273 |
| 3,794,934 | 2/1974 | Rhee | 331/111 X |
| 3,838,351 | 9/1974 | Hekimian | 330/104 |
| 3,889,197 | 6/1975 | Duff | 328/55 |
| 3,916,342 | 10/1975 | Higuchi et al. | 331/111 |
| 4,012,645 | 3/1977 | Moorey | 307/293 |

FOREIGN PATENT DOCUMENTS

| | | | |
|---|---|---|---|
| 2236209 | 2/1974 | Fed. Rep. of Germany | 331/111 |
| 2647569 | 4/1978 | Fed. Rep. of Germany | 331/111 |

Primary Examiner—Siegfried H. Grimm
Attorney, Agent, or Firm—J. T. Cavender; Albert L. Sessler, Jr.; Elmer Wargo

[57] ABSTRACT

An interval timer circuit (similar to a relaxation oscillator) including a single comparator having first and second inputs thereto and an output therefrom. The circuit includes a first circuit leg having an R-C circuit with a control point therebetween, with said control point being connected to the second input of the comparator. A first reference voltage is established at the first input of the comparator whereby its output changes from a second state to a first state when an increasing or charging voltage at the control point exceeds the first reference voltage. A second circuit leg establishes a second reference voltage at the first input of the comparator in response to the first state at the output thereof. A third circuit leg or discharging circuit produces a decreasing voltage at the control point in response to the first state and when the decreasing voltage at the control point is less than the second reference voltage, the output of the comparator changes to its second state to repeat the process.

4 Claims, 3 Drawing Figures

4,264,879

INTERVAL TIMER CIRCUIT RELAXATION OSCILLATOR

BACKGROUND OF THE INVENTION

This invention relates to an interval timer circuit (similar to a relaxation oscillator).

A typical prior-art, interval timer circuit is of the type LM555 which is manufactured by a plurality of integrated circuit manufacturers, with one such circuit, for example, being manufactured by Texas Instrument Corporation.

While these prior art interval timer circuits perform satisfactorily, they do require two comparators (to determine the frequency of oscillation), an output buffer, a flip-flop, and several resistors. Generally, one comparator is used for sensing the higher threshold voltage ($\frac{2}{3}$ VCC) and the remaining one is used for sensing the lower threshold voltage ($\frac{1}{3}$ VCC).

SUMMARY OF THE INVENTION

In contrast with the prior art, interval-timer circuits which utilize two comparators, this invention utilizes a single comparator for detecting both the upper and lower threshold values and eliminates the need for an output buffer and a flip-flop used in the prior art circuit described.

The interval timer circuit of this invention includes a single comparator having first and second inputs thereto, and an output therefrom; a circuit network having a control point therein, which control point is coupled to the second input of the comparator; first means for establishing a first reference voltage at the first input whereby the output of the comparator changes from a second state to a first state when an increasing voltage at the control point exceeds the first reference voltage; second means for establishing a second reference voltage at the first input of the comparator in response to the first state of the output thereof; and third means for producing a decreasing voltage at the control point in response to the first state of output of the comparator whereby the output of the comparator changes to the first state when the decreasing voltage at the control point is less than the second reference voltage.

These advantages of this invention and others will be more readily understood in connection with the following detailed description, claims, and drawing.

DETAILED DESCRIPTION OF THE INVENTION

Figure 1:
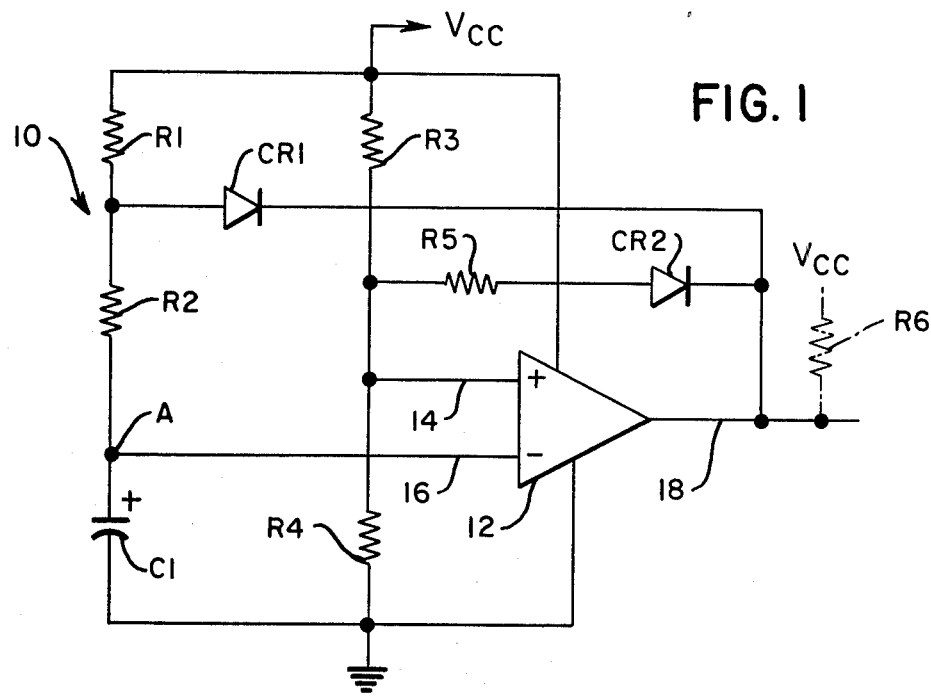
FIG. 1 is a schematic diagram of an interval timer circuit of a perferred embodiment of this invention.

FIG. 1 is a schematic diagram of a preferred embodiment of the interval timer circuit of this invention which is designated generally as 10.

The circuit 10 includes a comparator 12 having first and second inputs 14 and 16, respectively, thereto, and an output 18 therefrom. The comparator 12 may be of the open or non-open collector variety. An example of an open-collector comparator 12 is I.C. circuit chip LM339 which is manufactured by National Semiconductor Corp. Comparator 12 has the usual connections to a source of potential (VCC) and system ground.

The circuit 10 also includes a circuit network including resistors R1 and R2 and capacitor C1 which are series connected to form the network which is connected across the VCC potential and the system ground of the circuit 10. A control point A located at the junction of resistor R2 and capacitor C1 is connected to the second input 16 of the comparator 12. The remaining end of capacitor C1 is connected to system ground.

A first means for establishing a first reference voltage at the first input 14 of the comparator 12 includes a voltage divider network consisting of series-connected resistors R3 and R4, with the network being connected across the VCC potential and the system ground. The junction between resistors R3 and R4 is connected to the first input 14 of the comparator 12.

The circuit 10 also includes a second means for establishing a second reference voltage at the first input 14 of the comparator 12, which second means includes a resistor R5 and a diode CR2 which are series connected across the first input 14 and the output 18 of the comparator 12, with the cathode of this diode being connected to the output 18.

A diode CR1 having its anode connected to the junction between resistors R1 and R2 and its cathode connected to the output 18 of the comparator 12 provides a means for producing a decreasing voltage at control point A as will be described hereinafter.

The operation of the circuit 10 is as follows: When the VCC voltage is turned on, the capacitor C1 will begin to be charged exponentially via the resistors R1 and R2 and, consequently, the voltage at control point A will begin to increase towards the VCC voltage. The output of the comparator 12 at this time will be in a second state which represents the high impedance level with the first state representing the low impedance or conducting state.

When the comparator 12 is of the open collector variety, a pull up resistor R6 (shown in dashed outline in FIG. 1) may be utilized to drive the output 18 of the circuit 10 to the VCC potential. If the comparator 12 is of the non-open collector type, the resistor R6 may be eliminated.

In a preferred embodiment of this invention, the resistors R3, R4 and R5 are in the ratio of 6:12:4; consequently, the first reference voltage at the first input 14 of the comparator 12 will be set at $\frac{2}{3}$ VCC, as the resistor R5 does not affect the circuit at this time due to the fact that the output 18 is in the high impedance state and diode CR2 is non-conducting at this time.

As the voltage level at control point A increases due to the positive charging of capacitor C1, the output 18 of the comparator 12 will change from its second state to its first or low impedance state when the voltage level at control point A is greater than the first reference voltage ($\frac{2}{3}$ VCC) at the first input 14 of the comparator 12.

When the output 18 of the comparator 12 changes from its second state to its first state, which is essentially at reference ground, three situations occur, namely:

(1) The output of the circuit 10 from comparator 12 switches from a high voltage level to a low voltage level;

(2) Diode CR2 conducts causing resistor R5 to be switched into the circuit 10, causing the voltage at the first input 14 to drop to a second reference level of $\frac{1}{3}$ VCC; in effect, the combination of resistor R5 and diode CR2 is coupled in parallel with resistor R4; and (3) The diode CR1 conducts; causing the charge stored across capacitor C1 to discharge exponentially towards reference ground via the resistor R2 and the diode CR1, thereby causing a decreasing voltage at control point A.

When the decreasing voltage at control point A is less than the second reference level ($\frac{1}{3}$ VCC) at the first input 14, the comparator 12 detects this difference, causing its output to change from the first state to the second or high impedance state. When the output 18 of the comparator 12 changes to the second state, the diodes CR1 and CR2 become non-conducting, thereby interrupting the current flow through resistor R5, permitting the voltage level at the first input 14 of the comparator 12 to rise to the first reference level ($\frac{2}{3}$ VCC) and also permitting capacitor C1 to charge in a positive direction, whereby the process just described is repeated to produce the output shown in FIG. 2B.

Figure 2A:
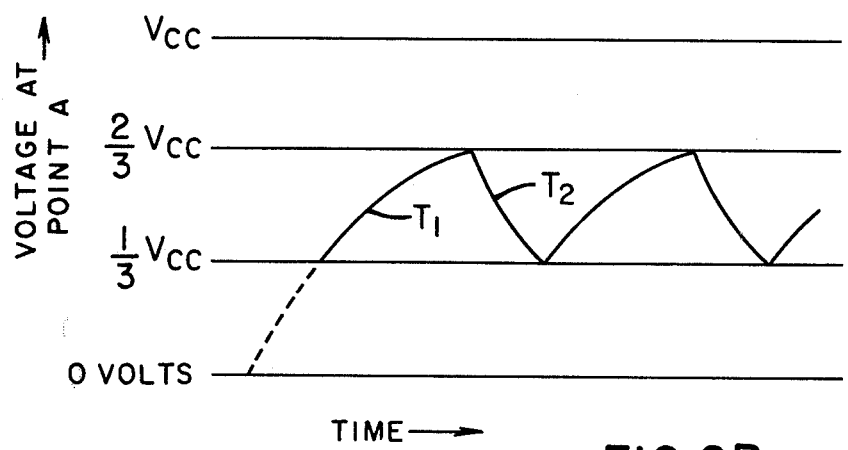
FIG. 2A is a waveform showing the voltage at a control point within the circuit shown in FIG. 1.
Figure 2B:
FIG. 2B is a waveform showing the output from the circuit shown in FIG. 1.

FIG. 2A shows the voltage level at control point A, with $T_1$ representing the time period for charging the capacitor C1 from $\frac{1}{3}$ VCC to $\frac{2}{3}$ VCC, and with $T_2$ representing the time period for discharging the capacitor C1 from $\frac{2}{3}$ VCC to $\frac{1}{3}$ VCC. With regard to time periods $T_1$ and $T_2$, a time period is determined by the general formula: T=RC; and specifically, $$T_1 = 0.6931 \text{ (R1 + R2) C1; and}$$

$$T_2 = 0.6931 \text{ (R2) C1}$$

The output frequency of the circuit 10 is as follows:

$$\text{freq. output} = \frac{1}{T_1 + T_2}.$$

In a typical application of the circuit 10, with resistors R1 and R2 being equal to 10K and 20K ohms, respectively, and with the capacitor C1 equal to 0.01 µfd, a square wave output frequency of 2.88 Khz is achieved at output 18 of the circuit 10. The resistors R3, R4, and R5 typically may be 6K, 12K and 4K ohms, respectively.

An additional feature of the circuit 10 is that the output frequency thereof remains constant even with some variation in the VCC voltage.

What is claimed is:

1. An interval timer circuit comprising:
a comparator having first and second inputs thereto and an output therefrom;
a circuit network having a control point therein operatively coupled to said second input;
first means for establishing a first reference voltage at said first input whereby the output of said comparator changes from a second state to a first state when an increasing voltage at said control point exceeds said first reference voltage;
second means for establishing a second reference voltage at said first input in response to said first state of said output;
said second means having only first and second ends with said first end being connected to said first input and said second end being connected to said output of said comparator; and third means for producing a decreasing voltage at said control point in response to said first state of said output whereby said output of said comparator changes to said second state when the decreasing voltage at said control point is less than said second reference voltage;
said circuit network comprising first and second resistors and a capacitor being series connected to form a circuit leg which is connected between a source of potential and a reference ground of said timing circuit, said control point being located at the junction of said second resistor and said capacitor with the remaining end of said capacitor being connected to said reference ground;
said first means comprising third and fourth resistors which are series connected between said source of potential and said reference ground, with the junction between said third and fourth resistors being connected to said first input of said comparator;
said second means comprising a fifth resistor and a diode which are series connected between said first input and the output of said comparator, with the cathode of said diode being connected to said output;
said third means comprising a second diode which is connected to a junction between said first and second resistors and the output of said comparator, with the cathode of said second diode being connected to said output of said comparator.

2. The circuit as claimed in claim 1 in which said third, fourth, and fifth resistors have resistance values which are in the ratio of 6:12:4, respectively, and said comparator is of the open collector type.

3. The circuit as claimed in claim 1 in which said third, fourth, and fifth resistors have resistance values which are in the ratio of 6:12:4, respectively, and said comparator is of the non-open collector type.

4. An interval timer circuit comprising:
a comparator having first and second inputs thereto and an output therefrom;
a circuit network having a control point therein operatively coupled to said second input;
first means for establishing a first reference voltage at said first input whereby the output of said comparator changes from a second state to a first state when an increasing voltage at said control point exceeds said first reference voltage;
second means for establishing a second reference voltage at said first input in response to said first state of said output;
said second means having only first and second ends with said first end being connected to said first input and said second end being connected to said output of said comparator; and
third means for producing a decreasing voltage at said control point in response to said first state of said output whereby said output of said comparator changes to said second state when the decreasing voltage at said control point is less than said second reference voltage;
said third means comprising a diode operatively coupled between said circuit network and said output of said comparator, with the cathode of said diode being connected to said output.

* * * * *